(12) United States Patent
Nagaiwa

(10) Patent No.: US 11,171,007 B2
(45) Date of Patent: Nov. 9, 2021

(54) PLASMA PROCESSING APPARATUS AND PLASMA ETCHING METHOD

(71) Applicant: TOKYO ELECTRON LIMITED, Tokyo (JP)

(72) Inventor: Toshifumi Nagaiwa, Hsin-chu (TW)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/646,290

(22) PCT Filed: Jun. 10, 2019

(86) PCT No.: PCT/JP2019/022981
§ 371 (c)(1),
(2) Date: Mar. 11, 2020

(87) PCT Pub. No.: WO2019/244700
PCT Pub. Date: Dec. 26, 2019

(65) Prior Publication Data
US 2020/0286737 A1 Sep. 10, 2020

(30) Foreign Application Priority Data
Jun. 22, 2018 (JP) .............................. JP2018-118926

(51) Int. Cl.
H01J 37/32 (2006.01)
H01L 21/3065 (2006.01)
(Continued)

(52) U.S. Cl.
CPC .... *H01L 21/3065* (2013.01); *H01J 37/32091* (2013.01); *H01J 37/32642* (2013.01); *H01L 21/683* (2013.01); *H05H 1/46* (2013.01)

(58) Field of Classification Search
CPC .......... H01J 37/32091; H01J 37/32642; H01L 21/3065; H01L 21/31116; H01L 21/67109; H01L 21/683; H01L 21/6831; H05H 1/46
(Continued)

(56) References Cited

U.S. PATENT DOCUMENTS

| 8,387,562 | B2 * | 3/2013 | Kikuchi | ............ | H01J 37/32623 118/723 E |
| 2008/0241420 | A1 * | 10/2008 | Dhindsa | ............ | H01J 37/32091 427/569 |
| 2013/0174105 | A1 * | 7/2013 | Nishio | ................ | H01L 21/6875 716/54 |

FOREIGN PATENT DOCUMENTS

| JP | 2007-258417 A | 10/2007 |
| JP | 2010-283028 A | 12/2010 |
| JP | 2017-228526 A | 12/2017 |

OTHER PUBLICATIONS

International Search Report issued for PCT Application No. PCT/JP2019/022981 dated Sep. 3, 2019, 5 pages.

* cited by examiner

*Primary Examiner* — Lan Vinh
(74) *Attorney, Agent, or Firm* — Rothwell, Figg, Ernst & Manbeck, P.C.

(57) ABSTRACT

An apparatus of plasma processing includes a substrate support and a focus ring that are arranged in a chamber. The focus ring surrounds a substrate on the substrate support. The focus ring has a first region and a second region. The first region includes an inner top surface of the focus ring. The second region includes an outer top surface of the focus ring. The inner top surface extends at a position closer to the central axis of the focus ring than the outer top surface. The focus ring is configured such that an absolute value of a
(Continued)

negative DC bias potential in the first region becomes greater than an absolute value of a DC potential in the second region during plasma generation in the chamber.

12 Claims, 10 Drawing Sheets

(51) Int. Cl.
 *H01L 21/683* (2006.01)
 *H05H 1/46* (2006.01)
(58) Field of Classification Search
 USPC .............. 156/345.14, 345.19, 345.3, 345.44,
 156/345.48; 438/706, 714
 See application file for complete search history.

PLASMA PROCESSING APPARATUS AND PLASMA ETCHING METHOD

CROSS REFERENCE TO RELATED APPLICATION

This application is a 35 U.S.C. 371 National Phase Entry Application from PCT/JP2019/022981, filed Jun. 10, 2019, which claims priority to Japanese Patent Application No. 2018-118926, filed Jun. 22, 2018, the disclosures of which are incorporated herein in their entirety by reference, and priority is claimed to each of the foregoing.

TECHNICAL FIELD

The present disclosure relates to a plasma processing apparatus and a plasma etching method.

BACKGROUND

In manufacturing electronic devices, a plasma processing apparatus is used. The plasma processing apparatus includes a chamber and a substrate support. The substrate support is disposed in the chamber. The substrate support has a lower electrode. A radio-frequency power supply is electrically coupled to the lower electrode. A focus ring is mounted on the substrate support. The substrate support supports a substrate mounted thereon. The substrate is disposed in a region surrounded by the focus ring. The plasma processing apparatus described above is disclosed in, e.g., Patent Document 1.

The plasma processing apparatus disclosed in Patent Document 1 further includes a DC power supply. The DC power supply is electrically connected to the focus ring to adjust a bias voltage of the focus ring.

PRIOR ART

Patent Document 1: Japanese Patent Application Publication No. 2007-258417

In plasma etching performed by the plasma processing apparatus, it is required to control an etching rate at an edge region of the substrate while suppressing the effects on an etching rate at a central region of the substrate.

SUMMARY

In accordance with an exemplary embodiment of the present disclosure, there is provided an apparatus of plasma processing. The plasma processing apparatus includes a chamber, a substrate support, a radio-frequency power supply, and a focus ring. The substrate support is disposed in the chamber and includes a lower electrode. The radio-frequency power supply is electrically coupled to the lower electrode. The focus ring is disposed on the substrate support to surround a substrate. The focus ring has a first region and a second region. The first region includes an inner top surface of the focus ring. The second region includes an outer top surface of the focus ring. The inner top surface and the outer top surface extend in a circumferential direction around a central axis of the focus ring. The inner top surface extends at a position closer to the central axis than the outer top surface. The focus ring is configured such that an absolute value of a negative DC bias potential in the first region becomes greater than an absolute value of a DC potential in the second region during plasma generation in the chamber.

EFFECT

In accordance with one exemplary embodiment, it is possible to control the etching rate in the edge region of the substrate while suppressing the effects on the etching rate in the central region of the substrate.

DETAILED DESCRIPTION

Figure 1:
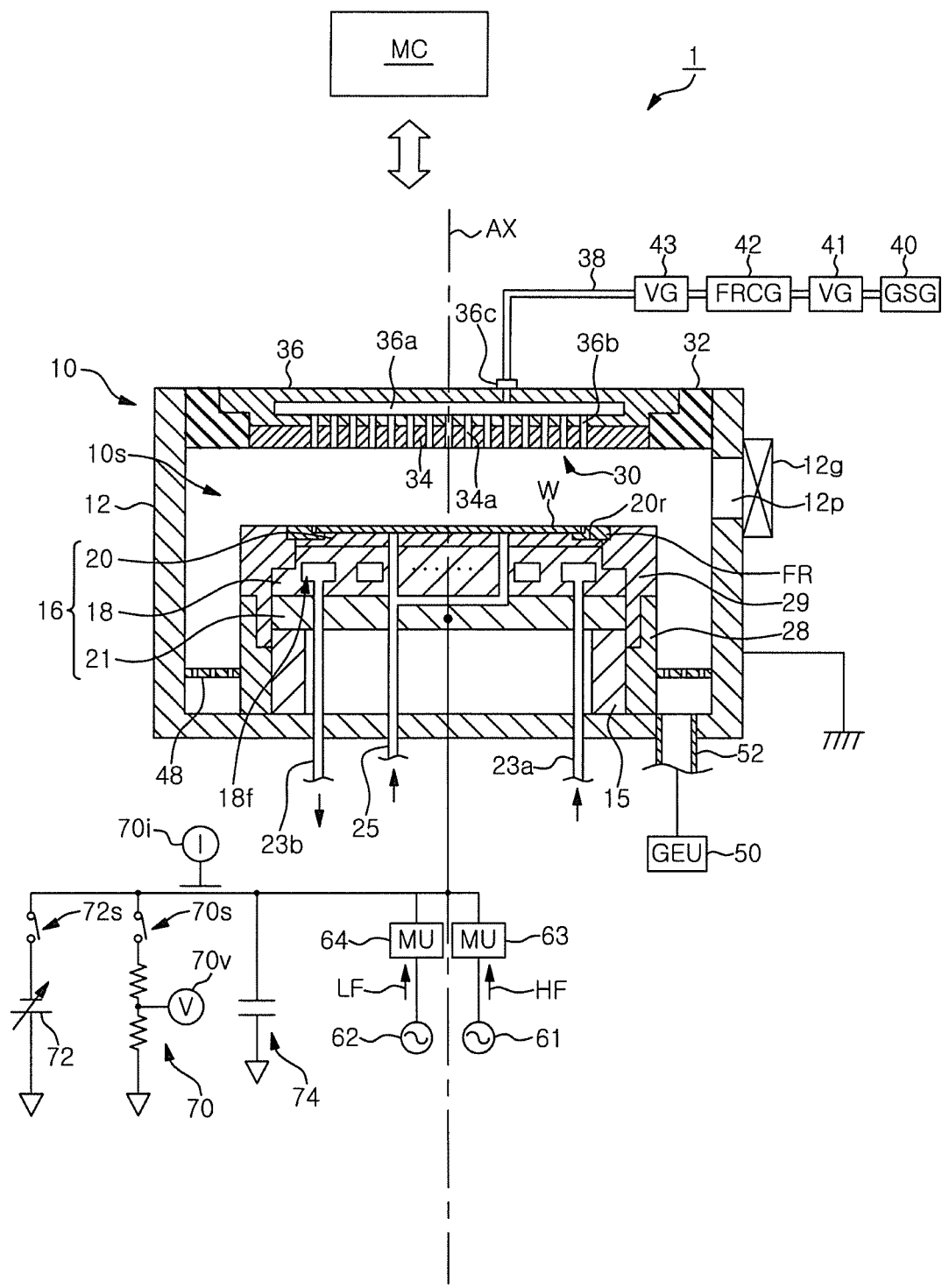
FIG. 1 schematically shows a plasma processing apparatus according to one exemplary embodiment.

Hereinafter, various exemplary embodiments will be described.

In one exemplary embodiment, a plasma processing apparatus is provided. The plasma processing apparatus includes a chamber, a substrate support, a radio-frequency power supply, and a focus ring. The substrate support is disposed in the chamber and includes a lower electrode. The radio-frequency power supply is electrically coupled to the lower electrode. The focus ring is disposed on the substrate support to surround a substrate. The focus ring has a first region and a second region. The first region includes an inner top surface of the focus ring. The second region includes an outer top surface of the focus ring. The inner top surface and the outer top surface extend in a circumferential direction around a central axis of the focus ring. The inner top surface extends at a position closer to the central axis than the outer top surface. The focus ring is configured such that an absolute value of a negative DC bias potential in the first region becomes greater than an absolute value of a DC potential in the second region during plasma generation in the chamber.

In one exemplary embodiment, a portion having a negative DC bias potential whose absolute value is relatively large on the top surface of the focus ring during the plasma generation is limited to the inner portion of the top surface, i.e., the inner top surface. In accordance with this embodiment, it is possible to adjust the etching rate in the edge region of the substrate while suppressing the influence on the etching rate in the central region of the substrate by adjusting the DC bias potential on the inner top surface.

In one exemplary embodiment, the first region and the second region may be electrically separated from each other. In this embodiment, the plasma processing apparatus may further include a DC power supply. The DC power supply is configured to apply a negative DC voltage to the first region in order to apply the negative DC bias potential to the first region.

In one exemplary embodiment, each of the first region and the second region has conductivity. In this embodiment, an insulator is disposed between the first region and the second region.

In one exemplary embodiment, the first region may include an inner region and an outer region. In this embodiment, the inner region and the outer region extend in the circumferential direction. The inner region includes the inner top surface and extends at a position closer to the central axis than the outer region. The second region is disposed on the outer region with the insulator therebetween.

In one exemplary embodiment, the first region may have conductivity, and the second region may be made of an insulator.

In one exemplary embodiment, the plasma processing apparatus may further include a first dielectric portion and a second dielectric portion. In this embodiment, an impedance of the first dielectric portion is lower than an impedance of the second dielectric portion. Each of the first region and the second region has conductivity. The first region is electrically coupled to the radio-frequency power supply through the first dielectric portion. The second region is electrically coupled to the radio-frequency power supply through the second dielectric portion.

In one exemplary embodiment, the inner top surface and the outer top surface may extend along a plane orthogonal to the central axis.

In one exemplary embodiment, the absolute value of the negative DC bias potential in the first region may be set to be greater than or equal to a lower limit. The lower limit is predetermined such that an etching rate in a central region of the substrate does not substantially change when the negative DC bias potential in the first region has an absolute value greater than or equal to the lower limit In another exemplary embodiment, a plasma etching method is provided. The plasma etching method includes: i) a process of generating plasma in a chamber of a plasma processing apparatus, and ii) a process of generating a negative DC bias potential in a first region of a focus ring during plasma generation. The plasma processing apparatus used in the plasma etching method is the plasma processing apparatus according to any one of the aforementioned exemplary embodiments. The absolute value of the negative DC bias potential in a first region is greater than an absolute value of a DC potential in the second region. The process of generating plasma and the process of generating the negative DC bias potential are performed in a state where the substrate is mounted on the substrate support in order to etch the substrate with chemical species from the plasma.

In still another exemplary embodiment, a method for determining a lower limit is provided. The method includes a process of obtaining a plurality of etching rates respectively corresponding to a plurality of negative DC bias potentials using the plasma processing apparatus according to any one of the aforementioned exemplary embodiments. In the process of obtaining the plurality of etching rates, a sequence is repeated while the plurality of negative DC bias potentials are sequentially set as the negative DC bias potential in the first region. The sequence includes a process of etching the substrate mounted on the substrate support by generating plasma in the chamber and generating the negative DC bias potential in the first region of the focus ring. The sequence includes a process of obtaining an etching rate in a central region of the substrate in the process of etching the substrate as an etching rate corresponding to the negative DC bias potential generated in the first region among the plurality of etching rates. The method further includes a process of determining a lower limit of the absolute value of the negative DC bias potential in the first region. The lower limit is determined using a relationship between the plurality of negative DC bias potentials and the plurality of etching rates corresponding thereto. The lower limit is determined so that the etching rate in the central region of the substrate does not substantially change when the negative DC bias potential in the first region is greater than or equal to the lower limit.

In still another exemplary embodiment, a plasma etching method is provided. The plasma etching method includes a process of obtaining a plurality of etching rates respectively corresponding to a plurality of negative DC bias potentials using the plasma processing apparatus according to any one of the aforementioned exemplary embodiments. In the process of obtaining the plurality of etching rates, a sequence is repeated while the plurality of negative DC bias potentials are sequentially set as the negative DC bias potential in the first region. The sequence includes a process of etching the substrate mounted on the substrate support by generating plasma in the chamber and generating the negative DC bias potential in the first region of the focus ring. The sequence includes a process of obtaining an etching rate in a central region of the substrate in the process of etching the substrate as an etching rate corresponding to the negative DC bias potential generated in the first region among the plurality of etching rates. The plasma etching method further includes a process of determining a lower limit of the absolute value of the negative DC bias potential in the first region. The lower limit is determined using a relationship between the plurality of negative DC bias potentials and the plurality of etching rates corresponding thereto. The lower limit is determined so that the etching rate in the central region of the substrate does not substantially change when the negative DC bias potential in the first region is greater than or equal to the lower limit. The plasma etching method further includes a process of etching the substrate mounted on the substrate support by generating plasma in the chamber and generating the negative DC bias potential having the absolute value greater than or equal to the lower limit in the first region of the focus ring.

Hereinafter, various exemplary embodiments will be described in detail with reference to the accompanying drawings. Like reference numerals will be given to like or corresponding parts throughout the drawings.

FIG. 1 schematically shows a plasma processing apparatus according to one exemplary embodiment. The plasma processing apparatus 1 shown in FIG. 1 is a capacitively coupled plasma processing apparatus. The plasma processing apparatus 1 includes a chamber 10. The chamber 10 has an inner space 10s. In one embodiment, the chamber 10 includes a chamber body 12. The chamber body 12 has a substantially cylindrical shape. The inner space 10s is provided in the chamber body 12. The chamber body 12 is made of, e.g., aluminum. The chamber body 12 is electrically grounded. A plasma-resistant film is formed on an inner wall surface of the chamber body 12, i.e., a wall surface that defines the inner space 10s. The plasma-resistant film may be a film formed by anodic oxidation treatment or a ceramic film such as a film made of yttrium oxide.

A passage 12p is formed at a sidewall of the chamber body 12. A substrate W is transferred between the inner space 10s and the outside of the chamber 10 through the passage 12p. The passage 12p can be opened and closed by a gate valve 12g disposed along the sidewall of the chamber body 12.

A substrate support, i.e., a supporting table 16, is disposed in the inner space 10s. The supporting table 16 is disposed in the chamber 10. The supporting table 16 is configured to support the substrate W mounted thereon. The supporting table 16 is supported by a supporting part 15. The supporting part 15 extends upward from a bottom portion of the chamber body 12. The supporting part 15 has a substantially cylindrical shape and is made of an insulating material such as quartz.

The supporting table 16 may include a lower electrode 18 and an electrostatic chuck 20. The supporting table 16 may further include an electrode plate 21. The electrode plate 21 is made of a conductive material such as aluminum and has a substantially disc shape. The lower electrode 18 is disposed on the electrode plate 21. The lower electrode 18 is made of a conductive material such as aluminum and has a substantially disc shape. The lower electrode 18 is electrically connected to the electrode plate 21.

A flow path 18f is formed in the lower electrode 18. The flow path 18f is a channel for a heat exchange medium. As an example of the heat exchange medium, a liquid coolant or a coolant (e.g., Freon) for cooling the lower electrode 18 by vaporization thereof is used. A circulation device (e.g., a chiller unit) for the heat exchange medium is connected to the flow path 18f. The circulation device is disposed outside the chamber 10. The heat exchange medium is supplied from the circulation device to the flow path 18f through a line 23a. The heat exchange medium supplied to the flow path 18f is returned to the circulation device through a line 23b.

The electrostatic chuck 20 is disposed on the lower electrode 18. When the substrate W is processed in the inner space 10s, the substrate W is mounted on and held by the electrostatic chuck 20. The electrostatic chuck 20 includes a main body and an electrode. The main body of the electrostatic chuck 20 is made of a dielectric material and has a substantially disc shape. The electrode of the electrostatic chuck 20 is a film-shaped electrode and is disposed in the main body of the electrostatic chuck 20. A DC power supply is electrically connected to the electrodes of the electrostatic chuck 20. When a voltage is applied from the DC power supply to the electrode of the electrostatic chuck 20, an electrostatic attractive force is generated between the electrostatic chuck 20 and the substrate W. Due to the electrostatic attractive force thus generated, the substrate W is attracted to and held on the electrostatic chuck 20.

The supporting table 16 has a mounting region 20r. The focus ring FR is mounted on the mounting region 20r. In one example, the mounting region 20r is an outer peripheral region of the electrostatic chuck 20. The focus ring FR has an annular shape and extends in a circumferential direction around the central axis (the axis AX shown in FIG. 1). The substrate W is mounted on a central region (substrate mounting region) of the electrostatic chuck 20. The focus ring FR surrounds the edge of the substrate W mounted on the central region of the electrostatic chuck 20.

The plasma processing apparatus 1 further includes a gas supply line 25. A heat transfer gas, e.g., He gas, is supplied through the gas supply line 25 from a gas supply mechanism to a gap between an upper surface of the electrostatic chuck 20 and a backside (bottom surface) of the substrate W.

The plasma processing apparatus 1 further includes a cylindrical member 28 and an insulating member 29. The cylindrical member 28 extends upward from the bottom portion of the chamber body 12. The cylindrical member 28 extends along an outer periphery of the supporting part 15. The cylindrical member 28 is made of a conductive material and has a substantially cylindrical shape. The cylindrical member 28 is electrically grounded. The insulating member 29 is disposed on the cylindrical member 28. The insulating member 29 is made of an insulating material. The insulating member 29 is made of ceramic such as quartz. The insulating member 29 has a substantially cylindrical shape. The insulating member 29 extends along an outer periphery of the electrode plate 21, an outer periphery of the lower electrode 18, and an outer periphery of the electrostatic chuck 20.

The plasma processing apparatus 1 further includes an upper electrode 30. The upper electrode 30 is disposed above the supporting table 16. The upper electrode 30 closes an upper opening of the chamber body 12 in cooperation with a member 32. The member 32 has an insulating property. The upper electrode 30 is held at an upper portion of the chamber body 12 through the member 32.

The upper electrode 30 includes a ceiling plate 34 and a holder 36. A bottom surface of the ceiling plate 34 defines an inner space 10s. The ceiling plate 34 is provided with a plurality of gas injection holes 34a. The gas injection holes 34a penetrate through the ceiling plate 34 in a plate thickness direction (vertical direction). The ceiling plate 34 is made of, e.g., silicon, but is not limited thereto. Alternatively, the ceiling plate 34 may have a structure in which a plasma-resistant film is formed on a surface of an aluminum base material. The plasma-resistant film may be a film formed by anodic oxidation treatment or a ceramic film such as a film made of yttrium oxide.

The holder 36 detachably holds the ceiling plate 34. The holder 36 is made of a conductive material such as aluminum. A gas diffusion space 36a is formed in the holder 36. A plurality of gas holes 36b extends downward from the gas diffusion space 36a. The gas holes 36b communicate with the gas injection holes 34a, respectively. A gas inlet port 36c is formed at the holder 36. The gas inlet port 36c is connected to the gas diffusion space 36a. A gas supply line 38 is connected to the gas inlet port 36c.

The gas supply line 38 is connected to a gas source group (GSG) 40 through a valve group (VG) 41, a flow rate controller group (FRCG) 42, and a valve group (VG) 43. The gas source group 40, the valve group 41, the flow rate controller group 42, and the valve group 43 constitute a gas supply unit. The gas source group 40 includes a plurality of gas sources. Each of the valve group 41 and the valve group 43 includes a plurality of valves (e.g., on-off valves). The flow rate controller group 42 includes a plurality of flow rate controllers. Each of the flow rate controllers of the flow controller group 42 is a mass flow controller or a pressure control type flow rate controller. The gas sources of the gas source group 40 are connected to the gas supply line 38 through the corresponding valves of the valve group 41, the corresponding flow rate controllers of the flow controller group 42, and the corresponding valves of the valve group 43. The plasma processing apparatus 1 can supply gases from one or more gas sources selected among the plurality of gas sources of the gas source group 40 to the inner space 10s at individually controlled flow rates.

A baffle plate 48 is disposed between the cylindrical member 28 and the sidewall of the chamber body 12. The baffle plate 48 may be formed by coating ceramic such as yttrium oxide on an aluminum base material, for example. A plurality of through-holes is formed in the baffle plate 48. Below the baffle plate 48, a gas exhaust line 52 is connected to the bottom portion of the chamber body 12. A gas exhaust unit (GEU) 50 is connected to the gas exhaust line 52. The gas exhaust unit 50 includes a pressure controller such as an automatic pressure control valve and a vacuum pump such as a turbo molecular pump. The gas exhaust unit 50 is configured to reduce a pressure in the inner space 10s.

In one embodiment, the plasma processing apparatus 1 further includes a radio-frequency power supply 61. The radio-frequency power supply 61 generates a radio-frequency power HF for plasma generation. The radio-frequency power HF has a frequency within a range of 27 MHz to 100 MHz, e.g., 40 MHz or 60 MHz. The radio-frequency power supply 61 is coupled to the lower electrode 18 through a matching unit (MU) 63 and the electrode plate 21 to supply the radio-frequency power HF to the lower electrode 18. The matching unit 63 has a matching circuit for matching an output impedance of the radio-frequency power supply 61 and an impedance of a load side (the lower electrode 18 side). The radio-frequency power supply 61 may not be electrically coupled to the lower electrode 18, and may be electrically coupled to the upper electrode 30 through the matching unit 63.

The plasma processing apparatus 1 further includes a radio-frequency power supply 62. The radio-frequency power supply 62 generates a bias radio-frequency power, i.e., a radio-frequency power LF, for attracting ions to the substrate W. The frequency of the radio-frequency power LF is lower than the frequency of the radio-frequency power HF. The frequency of the radio-frequency power LF is within a range of 400 kHz to 13.56 MHz, e.g., 400 kHz. The radio-frequency power supply 62 is coupled to the lower electrode 18 through a matching unit (MU) 64 and the electrode plate 21 to supply the radio-frequency power LF to the lower electrode 18. The matching unit 64 has a matching circuit for matching an output impedance of the radio-frequency power supply 62 and the impedance of the load side (the lower electrode 18 side).

In the plasma processing apparatus 1, a gas is supplied to the inner space 10s. Then, one or both of the radio-frequency power HF and the radio-frequency power LF are supplied to excite the gas in the inner space 10s. Accordingly, plasma is generated in the inner space 10s. The substrate W is processed by chemical species such as ions and/or radicals from the generated plasma.

Figure 2:
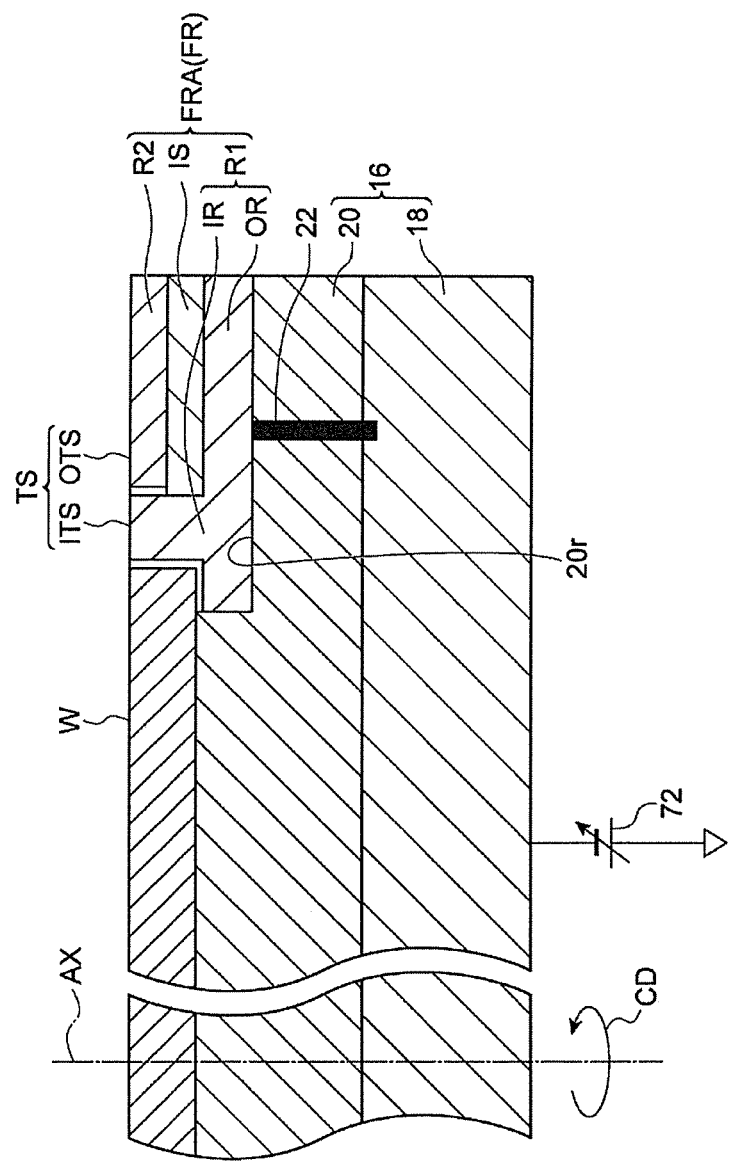
FIG. 2 is an enlarged cross-sectional view showing a part of a focus ring according to one exemplary embodiment together with a part of a substrate support of the plasma processing apparatus shown in FIG. 1.

Hereinafter, the descriptions will be given with reference to FIG. 2 together with FIG. 1. FIG. 2 is an enlarged cross-sectional view showing a part of a focus ring according to one exemplary embodiment together with a part of the substrate support of the plasma processing apparatus shown in FIG. 1. A focus ring FRA shown in FIG. 2 can be used as the focus ring FR in the plasma processing apparatus 1.

The focus ring FRA has a first region R1 and a second region R2. A top surface TS of the focus ring FRA includes an inner top surface ITS and an outer top surface OTS. The first region R1 includes the inner top surface ITS. The second region R2 includes the outer top surface OTS. The inner top surface ITS and the outer top surface OTS extend in the circumferential direction (the direction CD shown in FIG. 2) around the central axis (the axis AX shown in FIG. 2) of the focus ring FRA. The inner top surface ITS extends at a position closer to the central axis of the focus ring FRA than the outer top surface OTS. Further, the inner top surface ITS extends in a diametrical direction from the inner end surface of the focus ring FRA, which faces the edge of the substrate W. The width of the inner top surface ITS in the diametrical direction (in a radial direction with respect to the central axis) is, e.g., not less than 3 mm and not more than 30 mm. In one embodiment, the inner top surface ITS and the outer top surface OTS extend along a plane orthogonal to the central axis of the focus ring FRA. In other words, in one embodiment, the inner top surface ITS and the outer top surface OTS have the same horizontal level.

The focus ring FRA is configured such that an absolute value of a negative DC bias potential in the first region R1 becomes greater than an absolute value of a DC potential in the second region R2 during plasma generation in the chamber 10. In one embodiment, the first region R1 and the second region R2 are electrically separated from each other. In one embodiment, each of the first region R1 and the second region R2 has conductivity, and an insulator IS is disposed between the first region R1 and the second region R2. Each of the first region R1 and the second region R2 is made of, e.g., silicon or silicon carbide (SiC).

In one embodiment, the first region R1 includes an inner region IR and an outer region OR. The inner region IR and the outer region OR extend in the circumferential direction (the direction CD shown in FIG. 2). The inner region IR includes the inner top surface ITS. The inner region IR extends at a position closer to the central axis (the axis AX shown in FIG. 2) of the focus ring FR than the outer region OR. The second region R2 is disposed on the outer region OR with the insulator IS therebetween.

In one embodiment, the plasma processing apparatus 1 may further include a DC power supply 72. The DC power supply 72 is configured to apply a negative DC voltage to the first region R1 in order to apply a negative DC bias potential to the first region R1. The DC power supply 72 is electrically connected to the first region R1. In one embodiment, the DC power supply 72 is electrically connected to the lower electrode 18 through a power supply line of the radio-frequency power LF and the electrode plate 21. As shown in FIG. 2, the lower electrode 18 is electrically connected to the first region R1 through a conductor 22. However, the DC power supply 72 may be electrically connected to the first region R1 without passing through at least one of the power supply line of the radio-frequency power LF, the electrode plate 21, and the lower electrode 18. For example, the DC power supply 72 may be connected to the first region R1 through a different electrical path.

In one embodiment, the absolute value of the negative DC bias potential in the first region R1 may be set to be greater than or equal to a lower limit. The lower limit is predetermined such that the etching rate in the central region of the substrate W does not substantially change when the negative DC bias potential in the first region R1 has an absolute value greater than or equal to the lower limit.

In one embodiment, the plasma processing apparatus 1 further includes a measurement circuit 70. The measurement circuit 70 has a voltage sensor 70v. The measurement circuit 70 is electrically connected to the lower electrode through the power supply line of the radio-frequency power LF and the electrode plate 21. The measurement circuit 70 may be electrically connected to the first region R1 without passing through at least one of the power supply line of the radio-frequency power LF, the electrode plate 21, and the lower electrode 18. For example, the measurement circuit 70 may be connected to the first region R1 through a different electrical path.

The measurement circuit 70 includes the voltage sensor 70v as described above. In addition, the measurement circuit 70 may include a current sensor 70i. In one embodiment, the measurement circuit 70 has a voltage divider circuit. In one example, the voltage divider circuit is a resistor voltage divider circuit. The voltage sensor 70v is connected to a node between two resistors of the resistor voltage divider circuit. The voltage sensor 70v is configured to acquire a measurement value of a voltage at the node, i.e., a measurement value indicating a DC potential of the first region R1.

The measurement circuit 70 may further include the current sensor 70i as described above. The current sensor 70i is configured to acquire a measurement value of a current flowing through an electrical path that connects the first region R1 and the measurement circuit 70.

The measurement circuit 70 and the DC power supply 72 are configured to be selectively connected to the first region R1. Therefore, the plasma processing apparatus 1 includes one or more switching elements. In one embodiment, the plasma processing apparatus 1 includes switching elements 70s and 72s for selectively connecting one of the measurement circuit 70 and the DC power supply 72 to the first region R1. Each of the switching elements 70s and 72s may be, e.g., a field effect transistor. When the switching element 70s is in a conducting state, one end of the voltage divider circuit of the measurement circuit 70 that is opposite to the ground is connected to the first region R1. When the switching element 72s is in a conducting state, the DC power supply 72 is connected to the first region R1. The controller MC controls the switching elements 70s and 72s such that one of the switching elements 70s and 72s is in a non-conducting state when the other one is in a conducting state.

The plasma processing apparatus 1 may not include the measurement circuit 70 and the switching elements 70s and 72s. In this case, the DC power supply 72 can be directly connected to the power supply line of the radio-frequency power LF.

The plasma processing apparatus 1 may further include a radio-frequency cutoff filter 74. The radio-frequency cutoff filter 74 is provided to prevent a radio-frequency power from flowing into the measurement circuit 70 and the DC power supply 72. The radio-frequency cutoff filter 74 has, e.g., a capacitor. One end of the capacitor of the radio-frequency cutoff filter 74 is connected to an electrical path between the first region R1 and the voltage divider circuit of the measurement circuit 70 and between the first region R1 and the DC power supply 72. The other end of the capacitor of the radio-frequency cutoff filter 74 is connected to the ground.

The plasma processing apparatus 1 further includes the controller MC. The controller MC is a computer including a processor, a storage device, an input device, a display device, and the like, and controls the respective components of the plasma processing apparatus 1. Specifically, the controller MC executes a control program stored in the storage device and controls the respective components of the plasma processing apparatus 1 based on recipe data stored in the storage device. The plasma processing apparatus 1 performs the processing specified by the recipe data under the control of the controller MC. Further, the plasma processing apparatus 1 performs methods according to various embodiments under the control of the controller MC.

Figure 3:
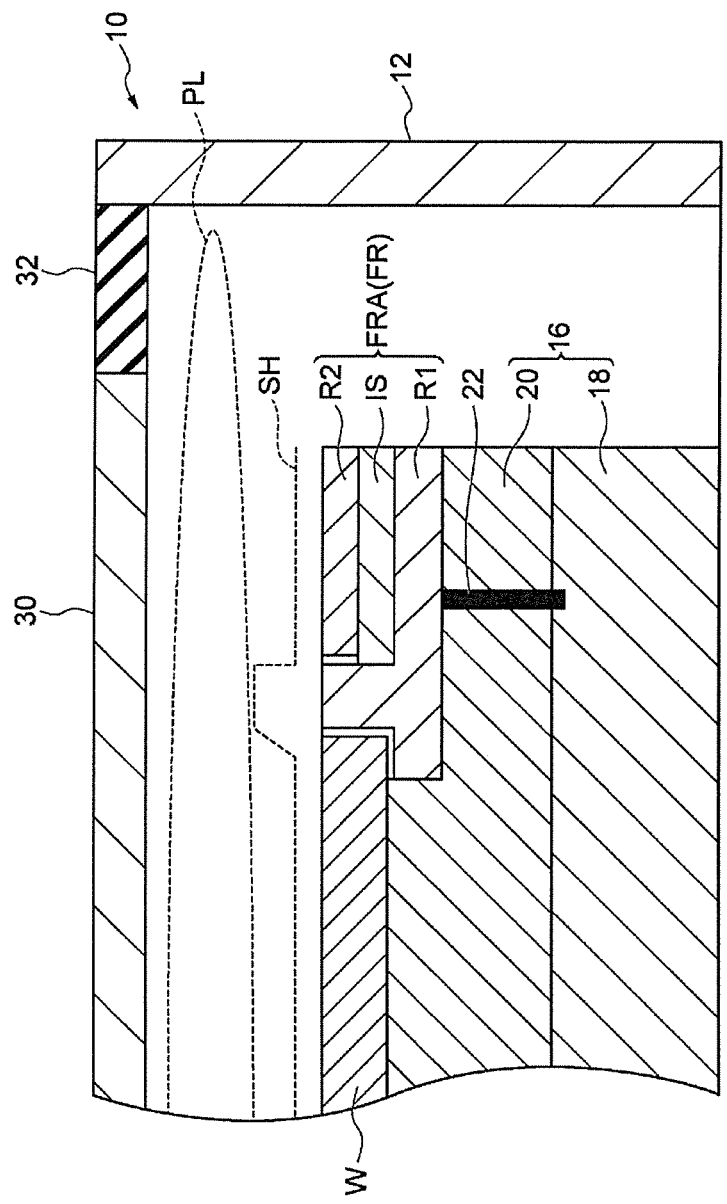
FIG. 3 shows an example of plasma and a sheath in the case of using the focus ring shown in FIG. 2.
Figure 4:
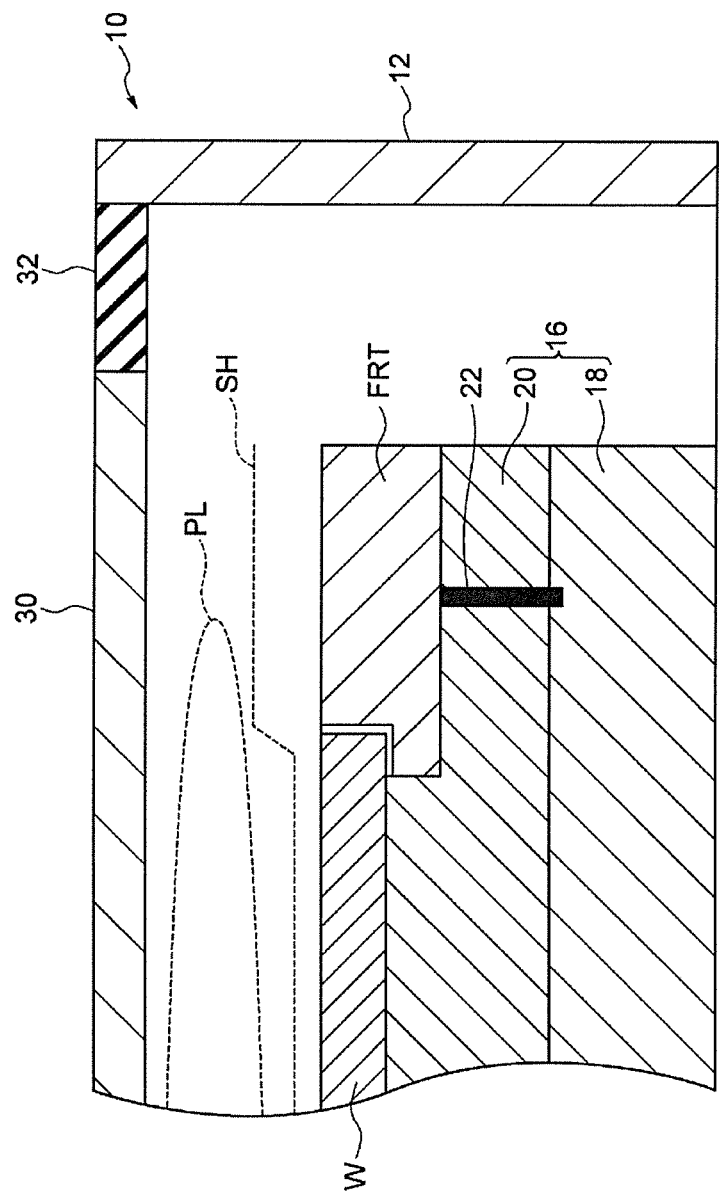
FIG. 4 shows an example of plasma and a sheath in the case of using a focus ring of a reference example.

Next, the descriptions will be given with reference to FIGS. 3 and 4. FIG. 3 shows an example of plasma and a sheath in the case of using the focus ring shown in FIG. 2. FIG. 4 shows an example of plasma and a sheath in the case of using a focus ring of a reference example. A focus ring FRT shown in FIG. 4 has conductivity. The focus ring FRT is not divided into the first region R1 and the second region R2. In other words, the top surface of the focus ring FRT is a continuous plane extending from the inner edge to the outer edge. The inner edge of the top surface of the focus ring FRT has the same diameter as that of the inner edge of the inner top surface ITS of the focus ring FRA. The outer edge of the top surface of the focus ring FRT has the same diameter as that of the outer edge of the outer top surface OTS of the focus ring FRA.

When a negative DC voltage is applied from the DC power supply 72 to the focus ring FRT mounted on the mounting region 20r, a sheath SH above the focus ring FRT becomes thicker than a sheath SH above the substrate W, as shown in FIG. 4. Since the top surface of the focus ring FRT has a relatively large width in the diametrical direction, the gap between the sheath SH and the upper electrode 30 (the ceiling of the chamber 10) becomes smaller in the region above the focus ring FRT where the width of the top surface of the focus ring FRT in the diametrical direction is relatively large. Therefore, the diffusion of the plasma PL in the diametrical direction is suppressed and the density of the plasma PL above the central region of the substrate W is increased. Accordingly, the etching rate in the central region of the substrate W is changed when the negative DC bias potential of the focus ring FRT is adjusted.

On the other hand, in the case of using the focus ring FRA, a portion having a negative DC bias potential, whose absolute value is relatively large on the top surface TS of the focus ring FRA during the plasma generation, is limited to the inner top surface ITS as shown in FIG. 3. Therefore, the gap between the sheath SH and the upper electrode 30 (the ceiling of the chamber 10) becomes smaller in a region having a relatively small width in the diametrical direction above the inner top surface ITS. Accordingly, in the case of using the focus ring FRA, the plasma PL can be diffused in the diametrical direction even if the negative DC bias potential in the first region R1 is adjusted. Hence, it is possible to adjust the etching rate in the edge region of the substrate W while suppressing the influence on the etching rate in the central region of the substrate W by adjusting the negative DC bias potential in the first region R1 of the focus ring FRA.

Figure 5:
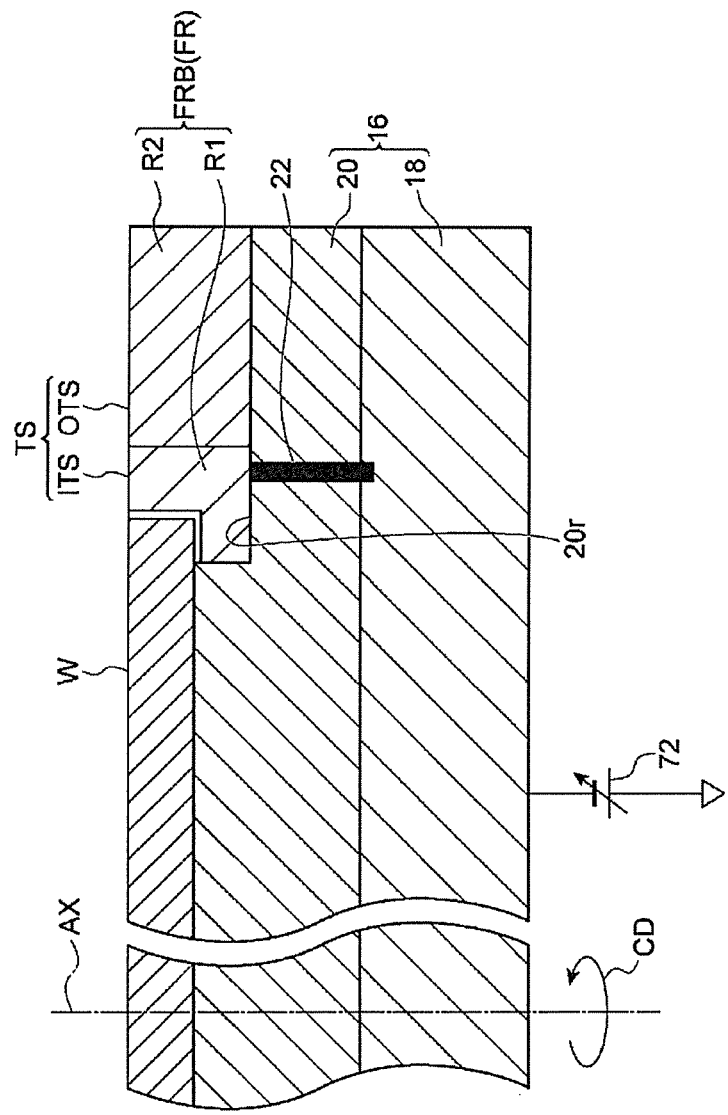
FIG. 5 is an enlarged cross-sectional view showing a part of a focus ring according to another exemplary embodiment together with a part of the substrate support of the plasma processing apparatus shown in FIG. 1.

Hereinafter, a focus ring according to another exemplary embodiment, which can be used as the focus ring FR in the plasma processing apparatus 1, will be described. FIG. 5 is an enlarged cross-sectional view showing a part of the focus ring according to another exemplary embodiment together with a part of the substrate support of the plasma processing apparatus shown in FIG. 1. A focus ring FRB shown in FIG. 5 can be used as the focus ring FR in the plasma processing apparatus 1. Hereinafter, the differences between the focus ring FRB and the focus ring FRA will be described.

In the focus ring FRB, each of the first region R1 and the second region R2 has an annular shape. The first region R1 extends at a position closer to the central axis (the axis AX shown in FIG. 5) of the focus ring FRB than the second region R2. The first region R1 of the focus ring FRB has conductivity and is made of silicon or silicon carbide (SiC), for example. The second region R2 of the focus ring FRB is made of an insulator. The DC power supply 72 is electrically connected to the first region R1 of the focus ring FRB.

Similar to the absolute value of the negative DC bias potential in the first region R1 of the focus ring FRA, the absolute value of the negative DC bias potential in the first region R1 of the focus ring FRB can be set to be greater than or equal to a lower limit. The lower limit is predetermined such that the etching rate in the central region of the substrate W does not substantially change when the negative DC bias potential in the first region R1 has an absolute value greater than or equal to the lower limit.

Figure 6:
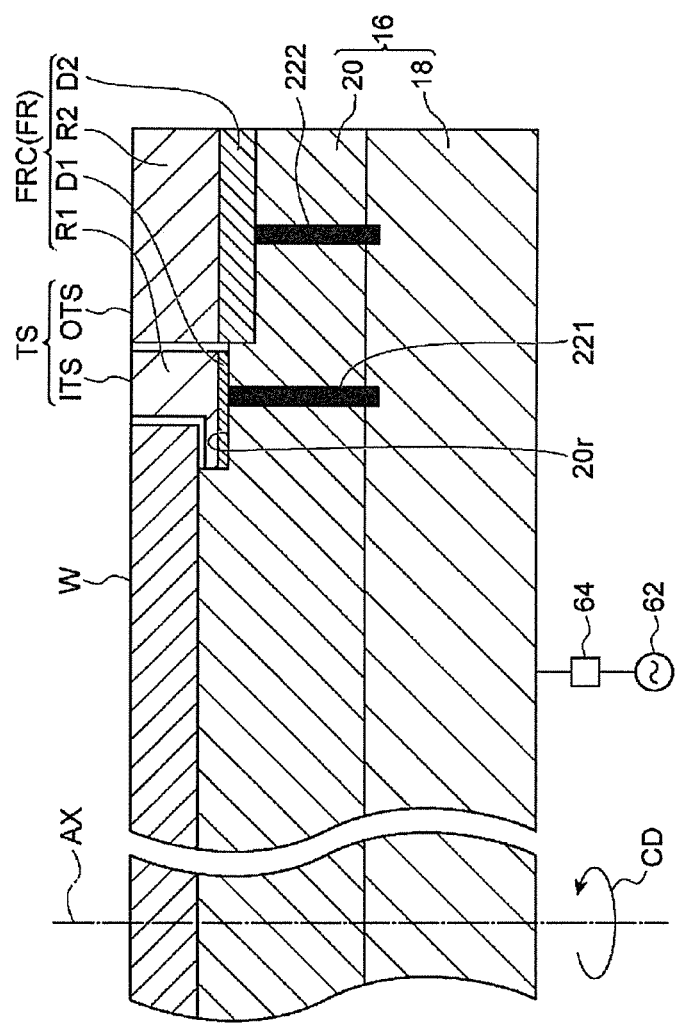
FIG. 6 is an enlarged cross-sectional view showing a part of a focus ring according to still another exemplary embodiment together with a part of the substrate support of the plasma processing apparatus shown in FIG. 1.

Next, a focus ring according to still another exemplary embodiment, which can be used as the focus ring FR in the plasma processing apparatus 1, will be described. FIG. 6 is an enlarged sectional view showing a part of the focus ring according to still another exemplary embodiment together with a part of the substrate support of the plasma processing apparatus shown in FIG. 1. The focus ring FRC shown in FIG. 6 can be used as the focus ring FR in the plasma processing apparatus 1. Hereinafter, the differences between the focus ring FRC and the focus ring FRA will be described.

In the focus ring FRC, each of the first region R1 and the second region R2 has an annular shape. The first region R1 extends at a position closer to the central axis (the axis AX shown in FIG. 6) of the focus ring FRC than the second region R2. Each of the first region R1 and the second region R2 of the focus ring FRC has conductivity and is made of silicon or silicon carbide (SiC), for example. In the focus ring FRC, the first region R1 is mounted on the mounting region 20r through a first dielectric portion D1. In the focus ring FRC, the second region R2 is mounted on the mounting region 20r through a second dielectric portion D2. The first dielectric portion D1 and the second dielectric portion D2 are made of the same dielectric material or different dielectric materials. An impedance of the first dielectric portion D1 is lower than that of the second dielectric portion D2.

The radio-frequency power supply 62 is electrically coupled to the first region R1 of the focus ring FRC through the first dielectric portion D1. Further, the radio-frequency power supply 62 is electrically coupled to the second region R2 of the focus ring FRC through the second dielectric portion D2. In one example, the radio-frequency power supply 62 is electrically coupled to the first region R1 through the electrode plate 21, the lower electrode 18, the conductor 221, and the first dielectric portion D1. Further, the radio-frequency power supply 62 is electrically coupled to the second region R2 through the electrode plate 21, the lower electrode 18, the conductor 222, and the second dielectric portion D2. A radio-frequency power supply different from the radio-frequency power supply 62 may be electrically coupled to the first region R1 of the focus ring FRC through the first dielectric portion D1. Further, the radio-frequency power supply different from the radio-frequency power supply 62 may also be electrically coupled to the second region R2 of the focus ring FRC through the second dielectric portion D2.

The first region R1 of the focus ring FRC is electrically coupled to the radio-frequency power supply 62 (or the different radio-frequency power supply) through the first dielectric portion D1 having a relatively low impedance. On the other hand, the second region R2 of the focus ring FRC is electrically coupled to the radio-frequency power supply 62 (or the different radio-frequency power supply) through the second dielectric portion D2 having a relatively high impedance. Therefore, the absolute value of the negative DC bias potential in the first region R1 of the focus ring FRC is greater than the absolute value of the negative DC bias potential in the second region R2 of the focus ring FRC. In the case of using the focus ring FRC, the plasma processing apparatus 1 may not include the DC power supply 72. Further, the plasma processing apparatus 1 may not include the measurement circuit 70.

Similar to the absolute value of the negative DC bias potential in the first region R1 of the focus ring FRA, the absolute value of the negative DC bias potential in the first region R1 of the focus ring FRC can be set to be greater than or equal to a lower limit. The lower limit is predetermined such that the etching rate in the central region of the substrate W does not substantially change when the negative DC bias potential in the first region R1 has an absolute value greater than or equal to the lower limit.

Figure 7:
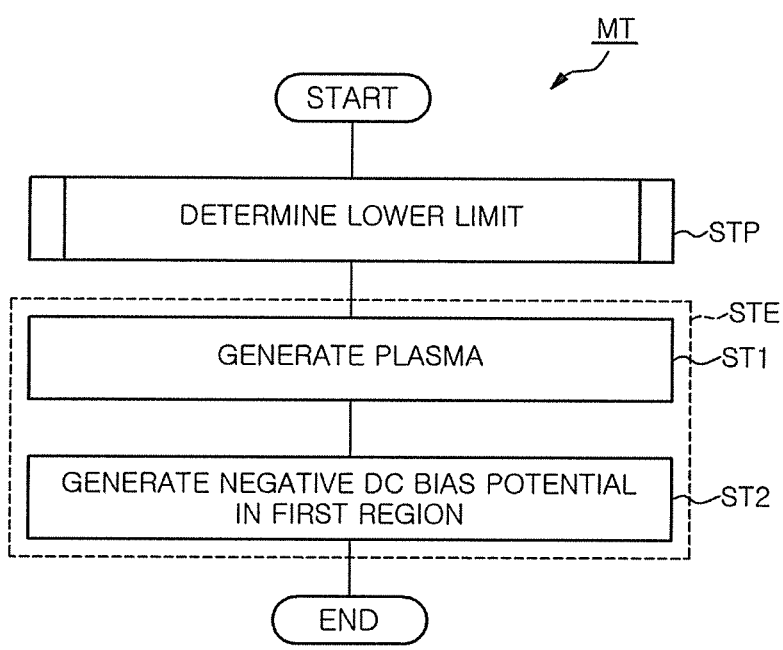
FIG. 7 is a flowchart showing a plasma etching method according to one exemplary embodiment.

Hereinafter, a plasma etching method according to one exemplary embodiment will be described. FIG. 7 is a flowchart showing a plasma etching method according to one exemplary embodiment. In the following description, the case of performing the plasma etching method (hereinafter, referred to as "method MT") shown in FIG. 7 using the plasma processing apparatus 1 will be described as an example.

The method MT includes step STE. In step STE, the substrate is etched. The method MT may further include step STP. Step STP is executed before the execution of step STE. In step STP, the lower limit of the negative DC bias potential in the first region R1 is determined. Step STP will be described in detail later.

The process STE includes steps ST1 and ST2. Steps ST1 and ST2 are executed in a state where the substrate is mounted on the supporting table 16 in order to etch the substrate with chemical species from the plasma. The substrate is disposed on a central region of the electrostatic chuck 20 and in a region surrounded by the focus ring FR.

In step ST1, plasma is generated in the chamber 10. Specifically, in step ST1, a gas is supplied from the gas supply unit into the chamber 10. In step ST1, a pressure in the chamber 10 is set to a specified pressure by the gas exhaust unit 50. In step ST1, the radio-frequency power LF or both of the radio-frequency power HF and the radio-frequency power LF are supplied. In step ST1, the gas is excited in the chamber 10. Accordingly, the plasma is generated from the gas in the chamber 10.

Next, step ST2 is executed during the plasma generation in step ST1. In step ST2, a negative DC bias potential having an absolute value greater than an absolute value of the DC potential in the second region R2 is generated in the first region R1 of the focus ring FR. In step ST2, the absolute value of the negative DC bias potential in the first region R1 is set to be within a range equal to or greater than the lower limit determined in step STP.

In the case of using the focus ring FRA or the focus ring FRB as the focus ring FR, a negative DC voltage from the DC power supply 72 is applied to the first region R1 in step ST2. In the case of using the focus ring FRC as the focus ring FR, in step ST2, the radio-frequency power LF from the radio-frequency power supply 62 is supplied to the first region R1 through the first dielectric portion D1 and is supplied to the second region R2 through the second dielectric portion D2. Alternatively, in the step ST2, a radio-frequency power from a radio-frequency power supply different from the radio-frequency power supply 62 may be supplied to the first region R1 through the first dielectric portion D1 and may also be supplied to the second region R2 through the second dielectric portion D2.

In the method MT, the substrate is etched by chemical species such as ions from the plasma. According to the method MT, it is possible to adjust the etching rate in the edge region of the substrate while suppressing the influence on the etching rate in the central region of the substrate by adjusting the DC bias potential in the inner top surface ITS.

The absolute value of the negative DC bias potential in the first region R1 during the plasma generation may be controlled within the range equal to or greater than the lower limit. By controlling the absolute value of the negative DC bias potential in the first region R1 within the range exceeding the lower limit, the position (position in the height direction) of the interface between the sheath and the plasma above the first region R1 can be controlled.

In one example, the absolute value of the negative DC bias potential in the first region R1 during the plasma generation is set based on a reference value (or an initial value) greater than the lower limit. When the absolute value of the negative DC bias potential in the first region R1 during the plasma generation is set to be lower than the reference value, the position of the interface between the sheath and the plasma above the first region R1 becomes lower than the reference position. The reference position is the position of the interface between the sheath and the plasma above the first region R1 in the case of setting the absolute value of the negative DC bias potential in the first region R1 during the plasma generation to the reference value. On the other hand, when the absolute value of the negative DC bias potential in the first region R1 during the plasma generation is set to be greater than the reference value, the position of the interface between the sheath and the plasma above the first region R1 becomes higher than the reference position. By controlling the position of the interface between the sheath and the plasma above the first region R1, the incidence angle of ions on the edge region of the substrate can be controlled. Therefore, by controlling the absolute value of the negative DC bias potential in the first region R1 during the plasma generation within the range equal to or greater than the lower limit, it is possible to control the incidence angle of ions on the edge region of the substrate while suppressing the influence on the etching rate in the central region of the substrate.

In another example, when the focus ring FR is consumed, the absolute value of the negative DC bias potential in the first region R1 during the plasma generation is set to be greater than the initial value. The initial value is set as the absolute value of the negative DC bias potential in the first region R1 during the plasma generation in the case of using the focus ring FR that has not been consumed. The initial value is greater than or equal to the lower limit. For example, the absolute value of the negative DC bias potential in the first region R1 during the plasma generation is increased from the initial value as the consumption of the focus ring FR progresses (as the thickness of the focus ring FR is decreased or as the height position of the inner top surface ITS is lowered). When the height position of the inner top surface ITS is lowered due to the consumption of the focus ring FR, the height position of the interface between the sheath and the plasma is lowered above the inner top surface ITS. Accordingly, ions are obliquely incident on the edge region of the substrate. In this example, when the focus ring FR is consumed, the height position of the interface between the sheath and the plasma above the inner top surface ITS is adjusted by increasing the absolute value of the negative DC bias potential in the first region R1 during the plasma generation from the initial value. Hence, in this example, when the focus ring FR is consumed, it is possible to make ions incident vertically on the edge region of the substrate while suppressing the influence on the etching rate in the central region of the substrate.

Figure 8:
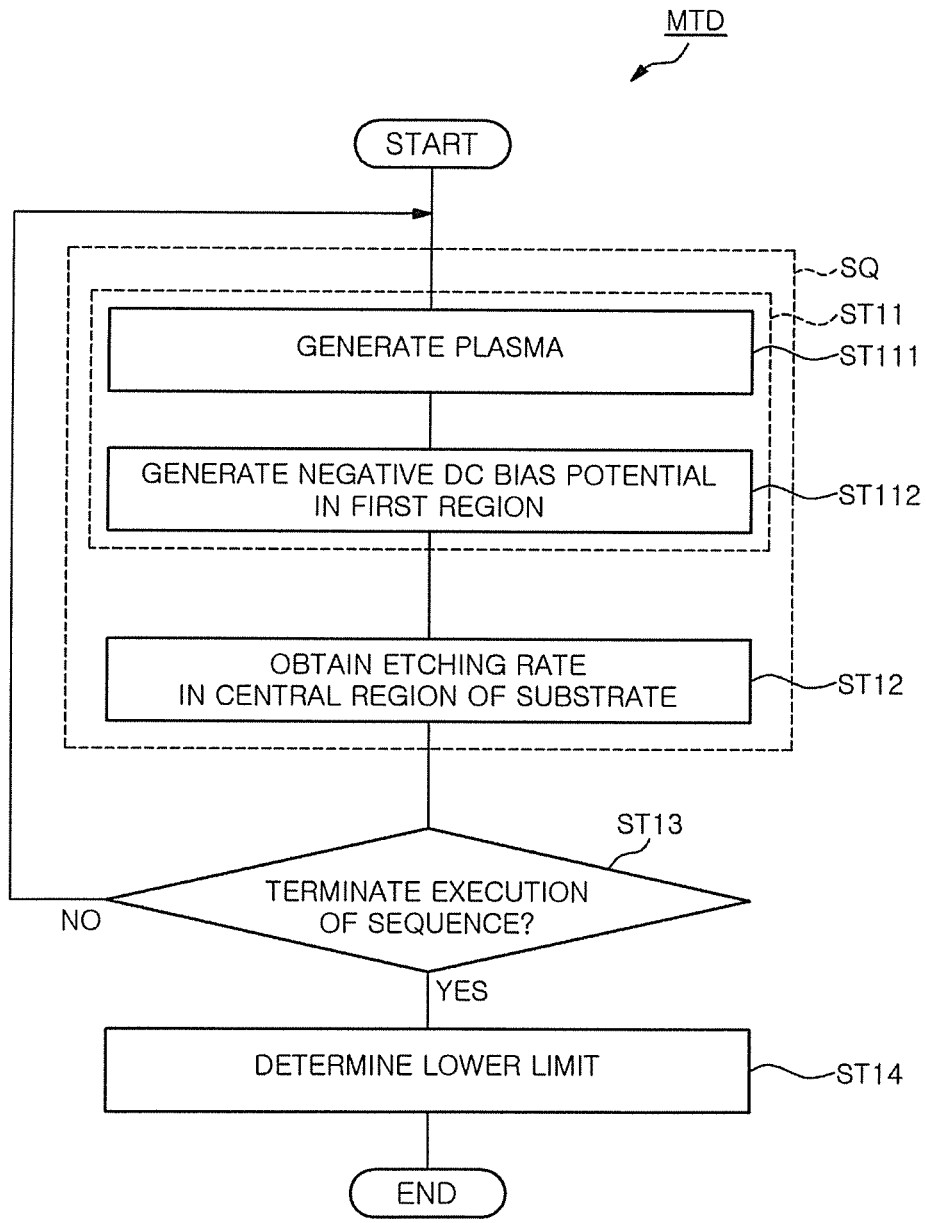
FIG. 8 is a flowchart showing a method of determining a lower limit according to one exemplary embodiment.

Hereinafter, the descriptions will be given with reference to FIG. 8. FIG. 8 is a flowchart showing a method of determining a lower limit according to one exemplary embodiment. In step STP of the method MT, a method MTD shown in FIG. 8 is performed. The method MTD includes a step of obtaining a plurality of etching rates respectively corresponding to a plurality of negative DC bias potentials.

In the step of obtaining the plurality of etching rates, a sequence SQ is repeated while the plurality of negative DC bias potentials are sequentially set as the negative DC bias potential in the first region.

The sequence SQ includes steps ST11 and ST12. Step ST11 is the same as step STE. In step ST11, the plasma is generated from a gas in the chamber 10 (step ST111). Then, the set negative DC bias potential is generated in the first region R1 (step ST112). In step ST11, the substrate is etched by chemical species such as ions from the generated plasma. The plasma generation conditions in step ST111 may be the same as those in step ST1.

In subsequent step ST12, the etching rate in the central region of the substrate etched in step ST11 is obtained. The etching rate is obtained by dividing a depth of an opening formed in the substrate by the processing time of step ST11. The etching rate obtained in step ST12 is used as an etching rate corresponding to the set bias potential, i.e., the negative DC bias potential generated in the first region R1 in step ST11, among the plurality of etching rates.

In subsequent step ST13, it is determined whether or not to terminate the execution of the sequence SQ. In step ST13, if there is a negative DC bias potential that has not been used in the sequence SQ among the plurality of negative DC bias potentials, it is determined that the execution of the sequence SQ is not terminated. When the execution of the sequence SQ is not terminated, the sequence SQ is executed again using the negative DC bias potential that has not been used in the sequence SQ among the plurality of negative DC bias potentials. On the other hand, when all of the negative DC bias potentials have been used in the sequence SQ, the relationship between the negative DC bias potentials and the etching rates corresponding thereto is obtained.

In step ST14, the lower limit of the absolute value of the negative DC bias potential in the first region R1 is determined. The lower limit is determined using the relationship obtained by repeating the sequence SQ, i.e., the relationship between the negative DC bias potentials and the etching rates corresponding thereto. The lower limit is determined such that the etching rate in the central region of the substrate does not substantially change when the negative DC bias potential in the first region R1 has an absolute value greater than or equal to the lower limit. In one example, the lower limit is determined such that the etching rate in the central region of the substrate is within a predetermined range when the negative DC bias potential in the first region R1 has an absolute value greater than or equal to the lower limit. The lower limit thus determined is used for determining the negative DC bias potential in the first region R1 in the step ST2.

While various embodiments have been described above, various omissions, substitutions, and changes may be made without being limited to the above-described embodiments. Further, other embodiments can be implemented by combining elements in different embodiments.

For example, the plasma processing apparatus including the focus ring FRA, the focus ring FRB, or the focus ring FRC may be any type of a plasma processing apparatus different from the capacitively coupled plasma processing apparatus. In the method MT, any type of a plasma processing apparatus other than the plasma processing apparatus 1 may be used. For example, an inductively coupled plasma processing apparatus, or a plasma processing apparatus for generating plasma using surface waves such as microwaves may be used as the plasma processing apparatus.

Further, the temperature of the focus ring FRA, the focus ring FRB, or the focus ring FRC may be adjusted. For example, a heater may be disposed in the electrostatic chuck 20. The heater may extend over the entire electrostatic chuck 20 to heat both of the substrate W and the focus ring. Alternatively, the heater may be disposed only directly below the mounting region 2r to heat only the focus ring. Alternatively, a first heater for heating the substrate W and a second heater for heating the focus ring may be provided. In the case of heating the focus ring FRB or FRC, a heater may be disposed only directly below the first region R1 or the second region R2 to heat only the first region R1 or the second region R2. Alternatively, in the case of heating the focus ring FRB or FRC, different heaters may be disposed directly below the first region R1 and the second region R2.

In the case of heating the focus ring FRA, a heat transfer sheet may be disposed on the mounting region 20r, and the focus ring FRA may be disposed on the mounting region 20r with the heat transfer sheet therebetween. In the case of heating the focus ring FRC, the first dielectric portion D1 and/or the second dielectric portion D2 may be made of an insulating heat transfer sheet.

In the above description, the temperature of the focus ring was adjusted by the heating. However, the temperature of the focus ring may be adjusted by the cooling. In this case, a cooling member such as a Peltier element or the like may be provided instead of or together with the heater.

Hereinafter, tests that have been conducted using the plasma processing apparatus 1 will be described.

(First to Sixth Test)

In the first to sixth test, the above-described focus ring FRT was mounted on the mounting region 20r. In the third test and the fourth test, the diametrically outer region of the entire top surface of the focus ring FRT was covered with an insulating tape. In the third test and the fourth test, the diametrical width of the exposed inner region of the entire top surface of the focus ring FRT was 1 cm. In the fifth test and the sixth test, the diametrically inner region of the entire top surface of the focus ring FRT was covered with an insulating tape. In the fifth test and the sixth test, the diametrical width of the exposed outer region of the entire top surface of the focus ring FRT was 1 cm. In the first to sixth test, the substrate was mounted on the electrostatic chuck 20, and a silicon oxide film of the substrate was etched. In the first to sixth test, a fluorocarbon gas was used as an etching gas. In the first to sixth test, the radio-frequency power HF and the radio-frequency power LF were supplied to the lower electrode. In the first, the third, and the fifth test, no DC voltage was applied from the DC power supply 72 to the focus ring FRT. In the second, the fourth, and the sixth test, a DC voltage of −500V was applied from the DC power supply 72 to the focus ring FRT.

Figure 9A:
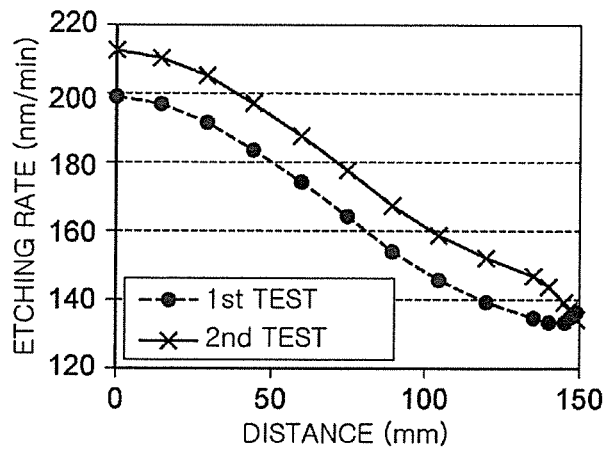
FIG. 9A is a graph showing the results of a first test and a second test.
Figure 9B:
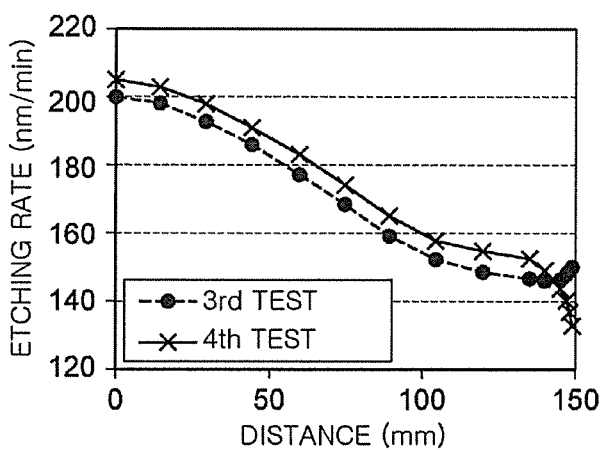
FIG. 9B is a graph showing the results of a third test and a fourth test.
Figure 9C:
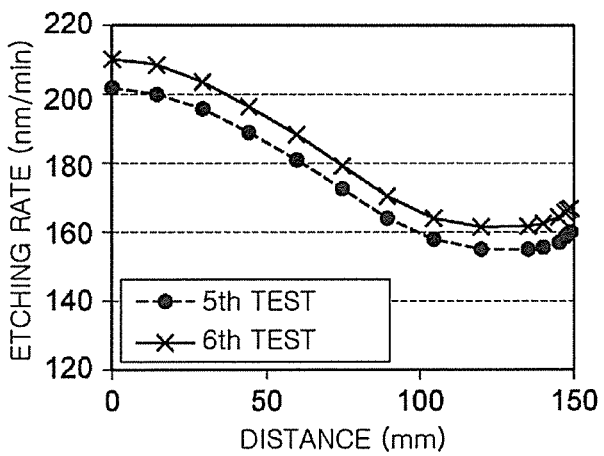
FIG. 9C is a graph showing the results of a fifth test and a sixth test.

In the first to sixth test, the diametrical distribution of the etching rate of the silicon oxide film was obtained. FIG. 9A is a graph showing the results of the first test and the second test. FIG. 9B is a graph showing the results of the third test and the fourth test. FIG. 9C is a graph showing the results of the fifth test and the sixth test. In the graphs shown in FIGS. 9A to 9C, the horizontal axis represents the distance from the center of the substrate and the vertical axis represents the etching rate of the silicon oxide film of the substrate.

As shown in FIG. 9A, the etching rate in the central region of the substrate obtained in the second test was significantly different from the etching rate in the central region of the substrate obtained in the first test. Therefore, it is clear that the etching rate in the central region of the substrate is changed by adjusting the negative bias voltage of the focus ring FRT whose top surface is entirely exposed.

As shown in FIG. 9C, the etching rate obtained in the sixth test was relatively greater than the etching rate obtained in the fifth test at all positions of the substrate in the diametrical direction. Therefore, it is clear that the relatively greater change in the etching rate occurs at all the positions of the substrate in the diametrical direction by adjusting the negative bias voltage of the focus ring FRT whose diametrically outer region on the top surface is only exposed.

As shown in FIG. 9B, the etching rate in the edge region of the substrate obtained in the fourth test was significantly different from the etching rate in the edge region of the substrate obtained in the third test. The difference between the etching rate in the central region of the substrate obtained in the fourth test and the etching rate in the central region of the substrate obtained in the third test was relatively small. The focus ring used in the third test and the fourth test is configured such that the negative DC bias potential, having an absolute value greater than that of the DC potential generated in the outer region of the top surface of the focus ring, is generated in the inner region of the top surface of the focus ring. Therefore, it is clear that it is possible to control the etching rate in the edge region of the substrate while suppressing the influence on the etching rate in the central region of the substrate by using any one of the focus rings FRA, FRB, and FRC.

(Seventh and Eighth Test)

In the seventh test, the focus ring FRA was mounted on the mounting region 20r, and silicon oxide films of multiple substrates were sequentially etched. In the etching of the silicon oxide films of the substrates in the seventh test, the negative DC voltage applied from the DC power supply 72 to the first region R1 was set to different DC voltages. In the eighth test, the focus ring FRT was mounted on the mounting region 20r, and silicon oxide films on multiple substrates were sequentially etched. In the etching of the silicon oxide films of the substrates in the eighth test, the negative DC voltage applied from the DC power supply 72 to the first region R1 was set to different DC voltages. In the seventh and the eighth test, a fluorocarbon gas was used as an etching gas. In the seventh and the eighth test, the radio-frequency power HF and the radio-frequency power LF were supplied to the lower electrode.

Figure 10:
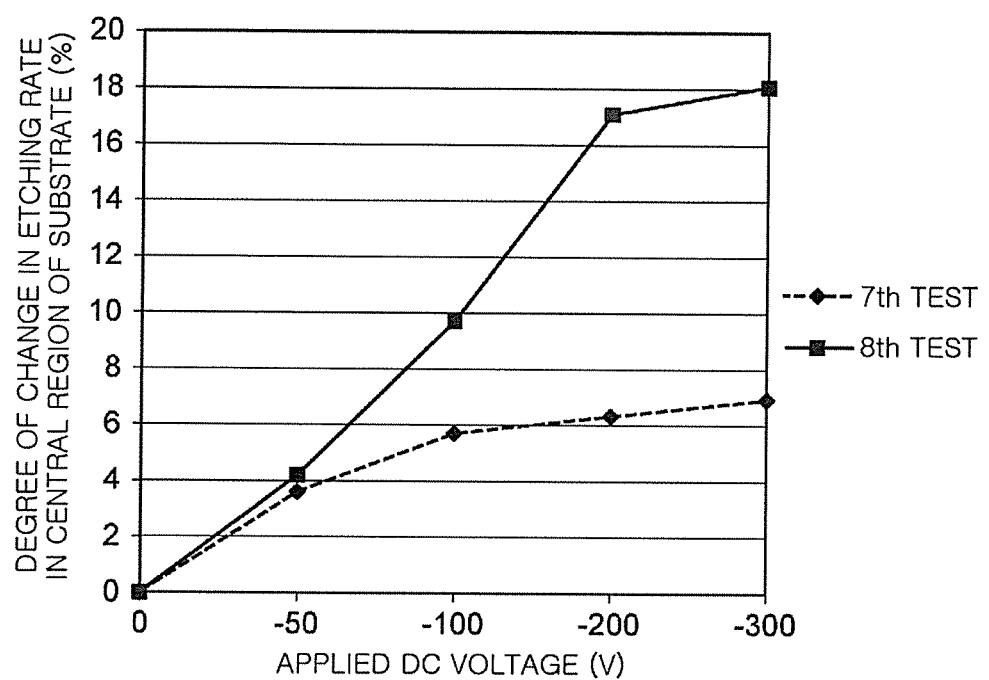
FIG. 10 is a graph showing the results of a seventh test and an eighth test.

In the seventh and the eighth test, the degree of change in the etching rate of the silicon oxide film in the central region of each substrate was obtained. In order to obtain the degree of change, the etching rate obtained when no DC voltage was applied from the DC power supply 72 to the focus ring was used as a reference etching rate. Specifically, the degree of change in the etching rate was obtained by calculating the difference between the reference etching rate and the target etching rate and calculating the ratio of the difference to the reference etching rate. FIG. 10 is a graph showing the results of the seventh test and the eighth test. In FIG. 10, the horizontal axis represents the DC voltage applied from the DC power supply 72 to the focus ring, and the vertical axis represents the degree of change in the etching rate in the central region of the substrate. As shown in FIG. 10, in the eighth test, as the absolute value of the negative DC voltage of the focus ring FRT was increased, the degree of change in the etching rate in the central region of the substrate was increased. On the other hand, in the seventh test, the degree of change in the etching rate in the central region of the substrate wad hardly changed when the absolute value of the negative DC voltage in the first region R1 of the focus ring FRA was greater than or equal to 100V. Therefore, it is clear that the lower limit can be set such that the etching rate in the central region of the substrate W does not substantially change when the negative DC bias potential in the first region R1 has an absolute value greater than or equal to the lower limit. It is also clear that it is possible to suppress the influence on the etching rate in the central region of the substrate by adjusting the absolute value of the negative DC bias potential applied to the first region R1 within the range equal to or greater than the lower limit.

From the foregoing, it will be appreciated that various embodiments of the present disclosure have been described herein for purposes of illustration and various changes can be made without departing from the scope and spirit of the present disclosure. Accordingly, various embodiments described herein are not intended to be limiting, and the true scope and spirit are indicated by the following claims.

DESCRIPTION OF REFERENCE NUMERALS

1: plasma processing apparatus
10: chamber
16: supporting table
18: lower electrode
62: radio-frequency power supply
FR: focus ring
R1: first region
R2: second region
ITS: inner top surface
OTS: outer top surface

The invention claimed is:

1. An apparatus of plasma processing comprising:
a chamber;
a substrate support disposed in the chamber and including a lower electrode;
a radio-frequency power supply electrically coupled to the lower electrode; and
a focus ring disposed on the substrate support to surround a substrate,
wherein the focus ring has a first region and a second region,
the first region includes an inner top surface of the focus ring,
the second region includes an outer top surface of the focus ring,
the inner top surface and the outer top surface extend in a circumferential direction around a central axis of the focus ring,
the inner top surface extends at a position closer to the central axis than the outer top surface, and
the focus ring is configured such that an absolute value of a negative DC bias potential in the first region becomes greater than an absolute value of a DC potential in the second region during plasma generation in the chamber,
wherein the first region and the second region are electrically separated from each other,
the plasma processing apparatus further comprising:
a DC power supply configured to apply a negative DC voltage to the first region in order to apply the negative DC bias potential to the first region,
wherein each of the first region and the second region has conductivity, and an insulator is disposed between first region and the second region,
wherein the first region includes an inner region and an outer region,
wherein the inner region and the outer region extend in the circumferential direction,
the inner region includes the inner top surface and extends at a position closer to the central axis than the outer region;
the second region is disposed on the outer region with the insulator therebetween.

2. The apparatus of claim 1, wherein the first region has conductivity and the second region is made of an insulator.

3. The apparatus of claim 1, wherein the inner top surface and the outer top surface have the same horizontal level.

4. The apparatus of claim 1, wherein the absolute value of the negative DC bias potential in the first region is set to be greater than or equal to a lower limit,
wherein the lower limit is predetermined such that an etching rate in a central region of the substrate does not substantially change when the negative DC bias potential in the first region has an absolute value greater than or equal to the lower limit.

5. The apparatus of claim 1, wherein the substrate support includes:
an electrostatic chuck disposed on the lower electrode and
a conductor through which the lower electrode is electrically connected to the first region,
wherein the focus ring is mounted on the electrostatic chuck.

6. The apparatus of claim 5, wherein the DC power supply is electrically connected to the first region.

7. An apparatus of plasma processing comprising:
a chamber;
a substrate support disposed in the chamber and including a lower electrode;
a radio-frequency power supply electrically coupled to the lower electrode; and
a focus ring disposed on the substrate support to surround a substrate,
wherein the focus ring has a first region and a second region,
the first region includes an inner top surface of the focus ring,
the second region includes an outer top surface of the focus ring,
the inner top surface and the outer top surface extend in a circumferential direction around a central axis of the focus ring,
the inner top surface extends at a position closer to the central axis than the outer top surface, and
the focus ring is configured such that an absolute value of a negative DC bias potential in the first region becomes greater than an absolute value of a DC potential in the second region during plasma generation in the chamber,
the apparatus further comprising:
a first dielectric portion and a second dielectric portion,
wherein an impedance of the first dielectric portion is lower than art impedance of the second dielectric portion,
each of the first region and the second region has conductivity,
the first region is electrically coupled to the radio-frequency power supply through the first dielectric portion, and
the second region is electrically coupled to the radio-frequency power supply through the second dielectric portion.

8. The apparatus of claim 7, wherein the inner top surface of the focus ring and the outer top surface of the focus ring have the same horizontal level.

9. The apparatus of claim 7, wherein the absolute value of the negative DC bias potential in the first region is set to be greater than or equal to a lower limit,
wherein the lower limit is predetermined such that an etching rate in a central region of the substrate does not substantially change when the negative DC bias potential in the first region has an absolute value greater than or equal to the lower limit.

10. The apparatus of claim 7, wherein the first dielectric portion and the second dielectric portion are made of different dielectric materials.

11. The apparatus of claim 7, wherein the first dielectric portion and the second dielectric portion are made of the same dielectric materials.

12. A method of plasma etching comprising:
obtaining a plurality of etching rates respectively corresponding to a plurality of negative DC bias potentials using an apparatus of plasma processing, which includes a chamber, a substrate support disposed in the chamber and including a lower electrode, a radio-frequency power supply electrically coupled to the lower electrode, and a focus ring disposed on the substrate support to surround a substrate wherein the focus ring has a first region and a second region, the first region includes an inner top surface of the focus ring, the second region includes an outer top surface of the focus ring, the inner top surface and the outer top surface extend in a circumferential direction around a central axis of the focus ring, and the inner top surface extends at a position closer to the central axis than the outer top surface, and wherein in said obtaining the plurality of etching rates, a sequence, including a process of etching the substrate mounted on the substrate support by generating plasma in the chamber and generating a negative DC bias potential in the first region of the focus ring and a process of obtaining an etching rate in a central region of the substrate in the process of etching the substrate as an etching rate corresponding to the negative DC bias potential generated in the first region among the plurality of etching rates, is repeated while the plurality of negative DC bias potentials are sequentially set as the negative DC bias potential in the first region;

determining a lower limit of an absolute value of the negative DC bias potential in the first region, wherein the lower limit is determined using a relationship between the plurality of negative DC bias potentials and the plurality of etching rates corresponding thereto so that the etching rate in the central region of the substrate does not substantially change when the negative DC bias potential in the first region is greater than or equal to the lower limit; and etching the substrate mounted on the substrate support by generating plasma in the chamber and generating the negative DC bias potential having the absolute value greater than or equal to the lower limit in the first region of the focus ring.

* * * * *